United States Patent
How

(10) Patent No.: US 6,541,967 B1
(45) Date of Patent: Apr. 1, 2003

(54) METHODS OF USING FLUXGATE MAGNETOMETER ON MEASURING REMOTE AND DYNAMIC MAGNETIC SIGNALS

(76) Inventor: Hoton How, 262 Clifton St., Belmont, MA (US) 02478

( * ) Notice: Subject to any disclaimer, the term of this patent is extended or adjusted under 35 U.S.C. 154(b) by 0 days.

(21) Appl. No.: 09/447,295

(22) Filed: Nov. 23, 1999

(51) Int. Cl.⁷ .............................................. G01R 33/04
(52) U.S. Cl. ...................... 324/253; 324/260; 360/121
(58) Field of Search ................................. 324/254, 253, 324/255, 210, 212, 239, 240, 241, 242, 243, 244, 260; 33/258, 361; 360/313, 123, 124, 119, 120, 121, 122, 125, 111; 340/870.33

(56) References Cited

U.S. PATENT DOCUMENTS 2,768,243 A * 10/1956 Hare
2,891,236 A * 6/1959 Eisenberg ..................... 360/46
3,016,427 A * 1/1962 Grant ........................ 360/111
3,290,487 A * 12/1966 Scott ......................... 235/450
3,881,194 A * 4/1975 Heaslett et al. ............. 360/123
4,575,777 A * 3/1986 Hosokawa .................. 360/123
5,831,431 A * 11/1998 Gottfried-Gottfried et al. .. 324/239

* cited by examiner

Primary Examiner—Edward Lefkowitz
Assistant Examiner—Reena Aurora

(57) ABSTRACT

Disclosed is a method for achieving miniature fluxgate circuits capable of remotely sensing local dynamic magnetic fields. By synchronizing the excitation currents of the sensor core with the time-varying magnetic signals, the sensitivity can thus be improved, thereby enabling dynamic measurements at high speed. Also disclosed is a magnetic recording head device which uses a fluxgate magnetometer to measure a sequence of magnetic digital data bits, capable of providing dual reading and writing functions at high speeds, whose fabrication is fully compatible with the current printing circuit technologies.

10 Claims, 13 Drawing Sheets

--Prior Art--

$H_o > 0$

METHODS OF USING FLUXGATE MAGNETOMETER ON MEASURING REMOTE AND DYNAMIC MAGNETIC SIGNALS

BACKGROUND

1. Field of Invention

This invention is directed to a method and an apparatus of obtaining fast sensitive miniature magnetic sensors which measure local fields for recording head applications, as well as for other applications requiring remote sensing of weak magnetic signals.

2. Description of Prior Art

The fluxgate magnetic field sensor continues to be the preferred transducer for magnetic field measurements, not only because the supporting electronics is fairly simple and reliable, but also because new developments in materials sciences continue to push the noise figure to its intrinsic quantum limit. It is now approaching the point where the fluxgate device becomes an attractive alternative to the more complicated and costly SQUID fluxmeter. A fluxgate magnetometer is a device which measures magnetic fields utilizing the nonlinear magnetic characteristics of the ferromagnetic core material. The traditional ferromagnetic core material contained in the art consists of sheets or ribbons of permalloy, or amorphous ribbons with typical composition of iron-boron. The resolution of a fluxgate device is limited by Barkhausen noise associated with domain-wall motion in the core material. The sensitivity of fluxgate magnetometers using magnetic metal ribbons is in the order of 17 pT at room temperatures. The sensitivity of a SQUID device is about 1 pT at liquid helium temperatures (please refer to O. V. Nielsen, B. Herhando, J. R. Tetersen, and R. Primdahl, "Miniaturization of low cost metallic glass fluxgate sensors", J. Mag. Mag. Matr., 83, 405, 1990, for a general background on fluxgate magnetic sensors).

Furthermore, a fluxgate sensor contained in the art measures the global field which appears over the whole volume of the sensor core as an average. There is a need for sensitive fluxgate probes which measure the local fields associated with magnetic defect sites in materials for nondestructive evaluations, for example. Other applications include dynamic measurements of the local fields at high speeds associated with the data bits stored in a magnetic medium. The present fluxgate devices contained in the art have only been used for static or quasi-static field measurements. The possibility that a fluxgate sensor can measure a weak digital magnetic signal appearing in a data string at a high flow rate has never been considered in the art.

A magnetic induction-type recording head contained in the art measures the induction currents whenever the bits change signs in a data string. A more efficient way to measure a string of digital data is to measure the bits themselves, rather than their sign changes. For example, two consecutive bits of the same sign can not be measured in a straightforward manner by using an induction-type recoding head. A fluxgate recording head thus provides more efficiency, especially when synchronization is applied to the reading action. Synchronization locks the measurements at a specific frequency concurrent with the flow of the data string at fixed phases, which can reduce the noise content significantly, and hence improve the signal-to-noise ratio.

Although a fluxgate sensor has already been shown to provide the highest sensitivity in measuring a magnetic field at room temperatures, it has not yet been used as a magnetic recording head device reading data stored in a magnetic medium flowing at high speed. A ring-core fluxgate magnetometer contained in the art occupies a considerable volume. The ring-shaped geometry of the sensor core wound by inductor coils precludes the possibility that the sensor core can be configured into an open-arm structure detecting a magnetic field at a remote site. The fabrication of a ring-core fluxgate device is incompatible with the current printing-circuit technologies. Today, the biggest market for magnetic sensors is called for by the magnetic recording head industries, and there exists a constant need for miniature sensitive magnetometers included with recording head devices whose fabrication is compatible with the printing-circuit technologies facilitating mass production in large volumes, not only to increase reliability, but also to reduce costs.

Accordingly, it is an objection of the invention to address one or more of the foregoing disadvantages or drawbacks of the prior art, and to provide such improved method and apparatus to obtain sensitive miniature fluxgate devices for the measurement of weak magnetic fields.

Other objects will be apparent to one of ordinary skill, in light of the following disclosure, including the claims.

SUMMARY

In one aspect, the invention provides a method of achieving fluxgate operation allowing for detection arms to be extended from the sensor core so as to measure a local magnetic field at a remote site. The two pickup coils may be connected providing the same sense of induction or opposite sense of induction. The sensor geometry allows the sensor circuit to be miniaturized whose fabrication is compatible with the current printing circuit technologies.

In another aspect, the invention provides an apparatus of performing dynamic fluxgate operation measuring a weak magnetic signal associated with a data string. The excitation coil is synchronized with the data flow locked at specific phases so as to enhance signal-to-noise ratio, and hence to improve sensitivity.

BRIEF DESCRIPTION OF THE DRAWINGS

For a more complete understanding of the nature and objects of the present invention, reference is to be made to the following detailed description and accompanying drawings, which, though not to scale, illustrate the principles of the invention, and in which

FIG. 5B may be employed to derive the manipulation signal shown in FIG. 5A so as to provide phase lock onto the comprised pulses.

In FIG. 5C a weak magnetic signal containing a digital sequence of 10011101 is demonstrated and the detection, or recovery, of the digital signal is shown graphically that the gated signal following the fluxgate device is exclusively-anded with the manipulation signal derived in a manner shown in FIG. 5B.

DETAILED DESCRIPTION

Reference Numerals in Drawings

| | |
|---|---|
| 110, 310, 410 | Ferromagnetic Core Frame |
| 311, 312, 411, 412 | Ferromagnetic Detection Arm |
| 121, 323, 423, 424, 425 | Excitation Coil |
| 122, 321, 322, 421, 422 | Pickup Coil |
| 120, 320, 420 | Pickup-Coil Terminals |
| 130, 330, 430, 431 | Source Oscillator |
| 340, 440 | Gap Formed by Detection Arms |
| 150, 450 | Coil Support |

Prior Art—FIG. 1A, FIG. 1B, FIG.1C, FIG. 1D

A fluxgate device contained in the art employs an excitation coil winding around a ferromagnetic core shaped as a toroid, the so-called ring-core fluxgate magnetometer. The pickup coil is located outside enclosing the core and the excitation coil. To operate, an ac drive current is applied to the excitation coil producing a longitudinal magnetic field along the axial direction of the core. The drive field excites the core material encompassing the magnetized and the demagnetized states in alternation showing nonlinear variation in magnetic flux. Due to the canceling mechanism of the balanced structure of the coils and the sensor core only even harmonics of the drive current appear at the fluxgate terminals, and it is normally the second harmonics that is measured in the detection scheme.

Figure 1A:
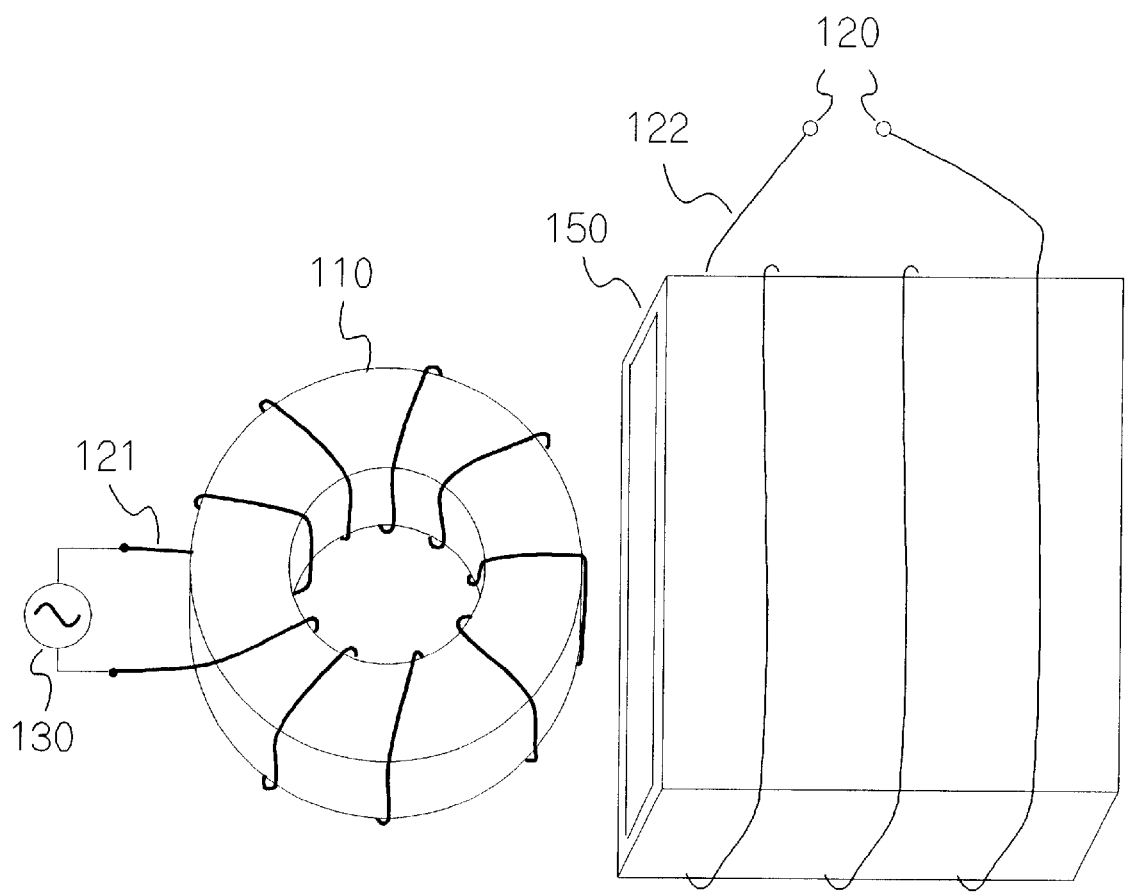
FIG. 1A shows the structure of a ring-core fluxgate magnetometer contained in the prior art.

A ring-core fluxgate magnetometer is shown in FIG. 1A. In FIG. 1A the core 110 is shaped as a toroid consisting of sheets or ribbons of permalloy, or amorphous ribbons with typical composition of iron-boron. A current source 130 is used which feeds the excitation coil 121 winding around the core. The pickup coil 122 winds around a hollow nonmagnetic support 150. To operate the assembly of the core 110 plus the excitation coil 121 is inserted into the cavity of the support 150 and the pickup terminals 120 are connected with the detection electronics described in the art measuring even harmonics of the current source 130.

Figure 1B:
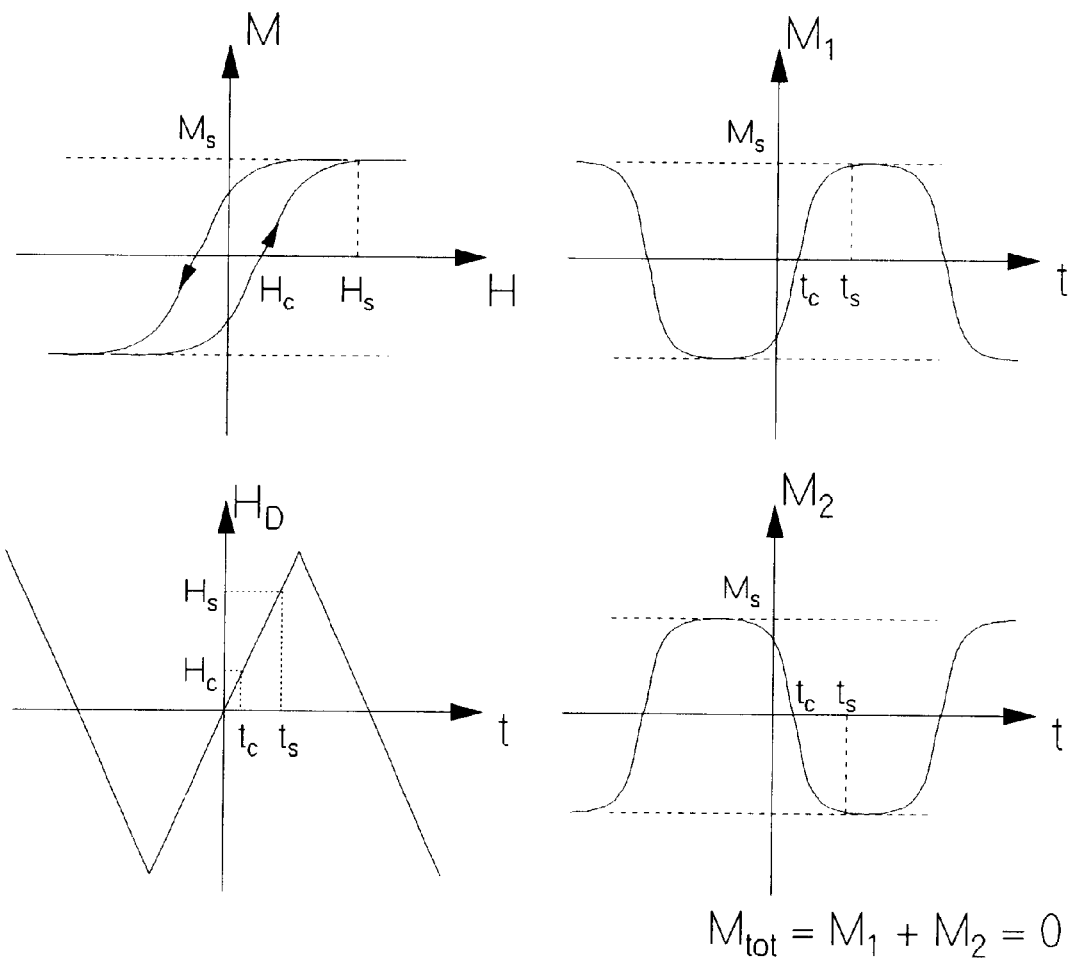
FIG. 1B illustrates the operation of a fluxgate magnetometer with a balanced sensing structure when the external field is zero.

In order to reveal fully the novel features of the present invention, it is informative to first describe the operation of a ring-core fluxgate magnetometer contained in the art. While simple explanations may not be found in the art, FIG. 1B, FIB. 1C, and FIG. 1D demonstrates the working principles enabling the operation of a ring-core fluxgate magnetometer. The magnetization curve for the core material is given at the upper left of FIG. 1B. In this plot M denotes the magnetization and H the internal field, and a hysteresis loop is shown in the M-H plane with coercive field $H_c$ and saturation field $H_s$. The saturation magnetization is $M_S$. Assume the external field $H_0$ is zero. The drive field $H_D$ then includes only the field generated by the excitation coil 120. The excitation coil 120 is connected with a current source 130 shown in FIG. 1A. Let $H_D$ be a triangular wave whose waveform is shown at the lower left of FIG. 1B. Other waveforms may be equally used. In FIG. 1B $t_c$ and $t_s$ denote the time that $H_D$ reaches $H_c$ and $H_s$, respectively.

In FIG. 1B $M_1$ and $M_2$ denote the magnetization at two corresponding points located at the upper and the lower halves of the core 110, respectively. Waveform for $M_1$, shown at the upper right of FIG. 1B, is derived as the output curve using the M-H plot, the upper left of FIG. 1B, as the transfer curve, and the $H_D$-t plot, the lower left of FIG. 1B, as the input curve. Waveform for $M_2$, shown at the lower right of FIG. 1B, is derived in a similar way, but using the negative of $H_D$ as the input curve, since the magnetization changes direction from the upper half to the lower half of the core. The net magnetization at these two points is $M_{tot}=M_1+M_2$, which is zero due to the symmetry of the ring-core geometry and the manner in which the drive field is excited. Thus, by including all the points included within the core material the induced electromotive force at the two terminals of the pickup coil 120, FIG. 1A, is zero, if the external field $H_0=0$.

Figure 1C:
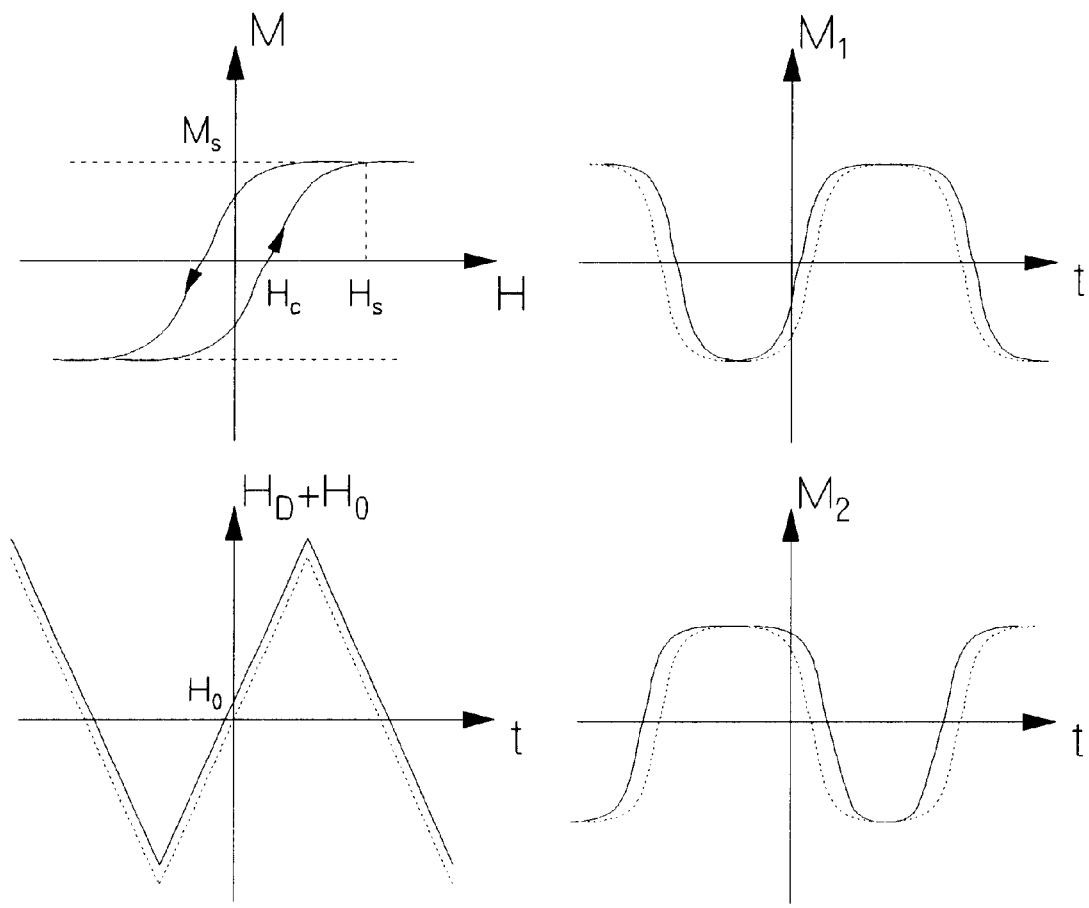
FIG. 1C illustrates the operation of a fluxgate magnetometer with a balanced sensing structure when the external field is greater than zero.
Figure 1D:
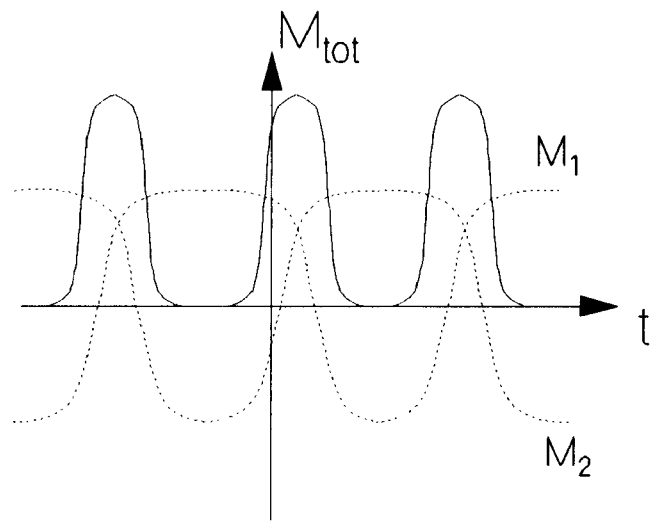
FIG. 1D continues illustrating the fluxgate operation of FIG. 1C. The induced electromotive force at the output terminals of the sensor is proportional to the time-rate change of the total flux enclosed within the pickup coils, appearing as second harmonics of the original driving signal shown in FIG. 1C.
Figure 1D:
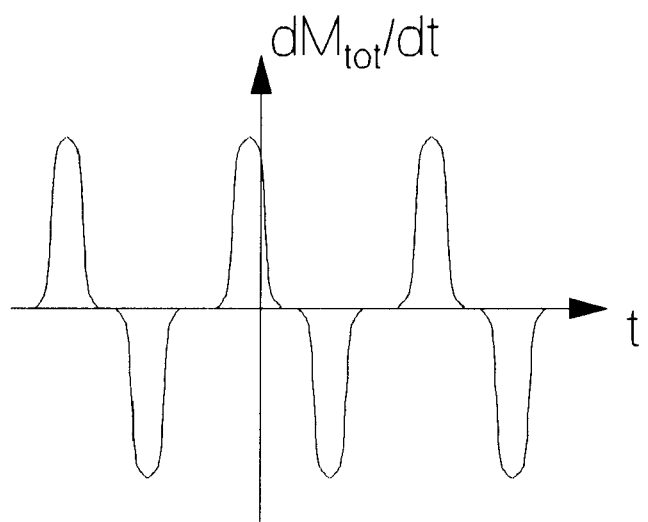

FIG. 1C shows the case that $H_0>0$. The same hysteresis curve is used which is shown at the upper left of FIG. 1C. However, $M_1$ is now derived by using $H_D +H_0$ as the input curve, which is shown as the solid triangular waveform at the lower left of FIG. 1D, and the dashed waveform there denotes $H_D$ only. The resultant waveform for $M_1$ is shown solid at the upper right of FIG. 1C. Analogously, $M_2$ is derived by using $-H_D+H_0$ as the input curve, whose waveform is shown solid at the lower right of FIG. 1C. The dashed curves shown in both $M_1$ and $M_2$ plots duplicate the original curves shown in FIG. 1B for $H_0=0$ for the purpose of comparison. The total magnetization at these two points is $M_{tot}=M_1+M_2$, which is shown solid at the top of FIG. 1D; the dashed curves in FIG. 1D denote the original $M_1$ and $M_2$ curves shown in FIG. 1C. The contributed electromotive force at the fluxgate terminals is proportional to the time-derivative of $M_{tot}$, which is plotted at the bottom of FIG. 1D. In FIG. 1D it is seen that, when $H_0>0$, the output waveform shows a non-vanishing amplitude whose frequency has been doubled when comparing to the input drive field shown at the lower left of FIG. 1B.

From the above graphic construction the following points are concluded: A voltage pulse is generated at the pickup terminals whenever the saturation-transition region is encompassed during core excitation. The pulse direction depends on the sign of the curvature of the magnetization curve at the saturation point, denoted as $C_s$, and the direction of the magnetization process. Thus, two voltage pulses are released for each sweep of the magnetization process along one direction, one pointing upward and the other downward, and for a full-cycle excitation four pulses are generated, explaining the frequency-doubling mechanism for fluxgate operation. The pulse width is proportional to $H_0+H_A$, where $H_A$ denotes the width of the saturation-transition region occurring in the magnetization process, and the slew rate of the pulse is proportional to $C_s$. The pulse height is proportional to $H_0$ if $H_0<<H_A$, and the pulse height saturates at a value proportional to the slope of the magnetization curve at the coercive point, if $H_0>>H_A$.

Thus, if $H_o$ is quasi-static, detection of $H_0$ then involves the measurement of a sequence of alternating pulses appearing at twice the excitation frequency. This can be done by using a lock-in amplifier which is phase locked at the second harmonic frequency. Alternatively, time filtering may be employed, and in this measuring scheme an active time-domain window is located at the position coincident with the peak of the pulses to sensitively detect the change of the pulses as a function of $H_0$.

However, if $H_0$ is a time-varying function with a high repetition rate, the excitation frequency is better shown a fixed relationship with that rate. For example, let $H_0$ be associated with the magnetic field generated by a string of data bits stored in a magnetic medium passing through the recording head at high speed. Denote $f$ to be the rate that data bits passing across the recording head. If the fluxgate sensor core is excited at a frequency of $f/4$ with phase lock so that the occurrence of the voltage pulses shown at the bottom of FIG. 1D coincident with the center of the transiting data bits, the operation is optimal. Thus, by measuring the direction of the induced voltage pulses the signs of the data bits are determined. A fluxgate recording head sensor described here compares favorably with an induction sensor contained in the art, not only because the fluxgate sensor core is excited at a frequency four times lower than the induction sensor core, but also because the phase-locked detection scheme employed by a fluxgate sensor can significantly reduce the noise content, thereby improving the sensitivity and accuracy of the recording head.

Before ending this Section the necessary conditions enabling fluxgate operation are summarized as follows:

(1) the output pickup voltage is zero if $H_0$ is zero; this implies a balanced structure of the fluxgate sensor;

(2) $H_0$ is parallel to $H_D$ in one half of the core, but anti-parallel in the other half of the core; this allows various fluxgate core geometries to be constructed;

(3) Magnetic saturation is encompassed during core excitation; this suggests the use of a saturated core avoiding altogether domain-wall motion during core excitation.

In this analysis, hysteretic effects are accounted for by including a time delay, $t_c$, in the output waveforms, for example, as shown in FIG. 1B. Although discussions made in this Section assumed a triangular excitation current, other waveform excitations can also be used, and similar results shown in FIG. 1D can be obtained provided that the magnetization curve is scaled or transferred accordingly as described in association with FIG. 1B and FIG. 1C. Actually, by choosing an excitation current with a proper waveform the saturation-transition regions, or saturation knees, in the magnetization curve can be allocated in the output waveform coincident with the transiting data bits, as required by the optimal operation of a fluxgate sensor used as a recording head reading the stored data in a magnetic medium.

Figure 2A:
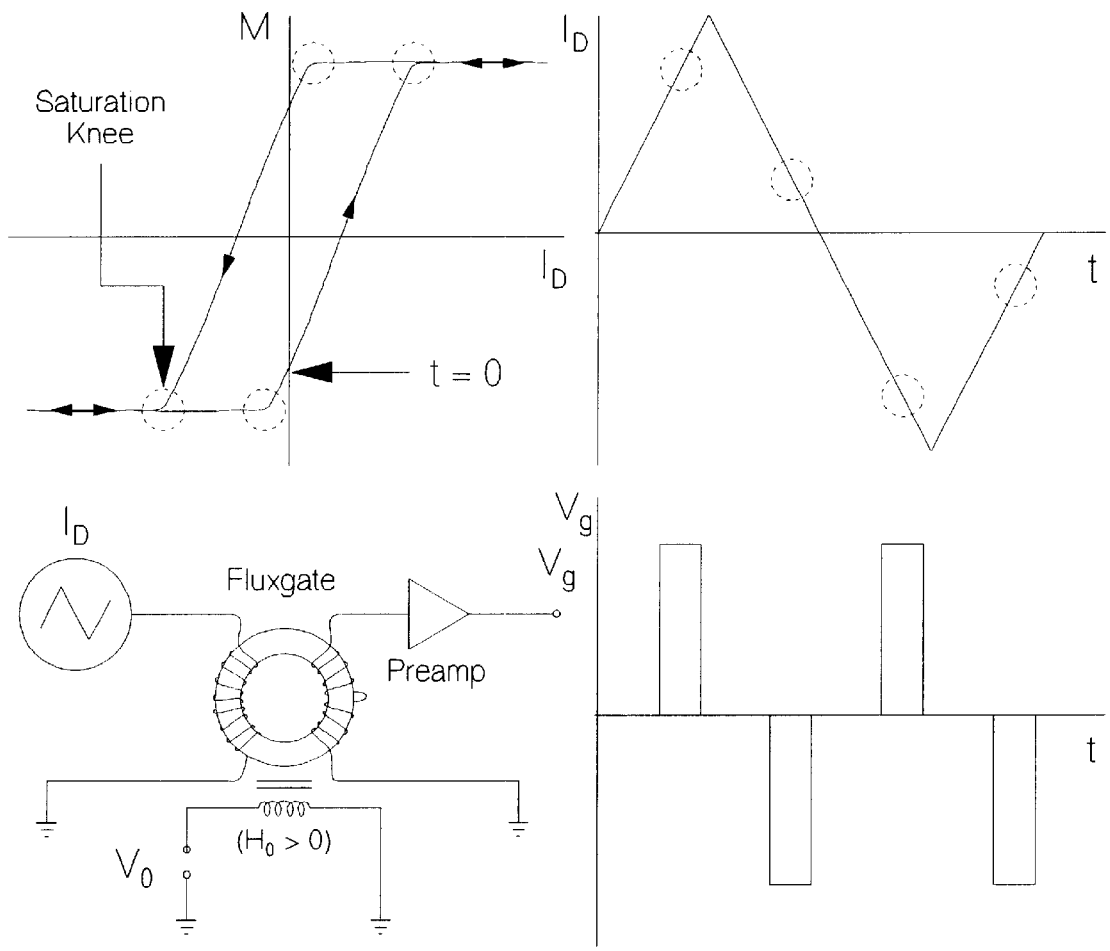
FIG. 2A summarizes operations of a fluxgate magnetometer demonstrated in FIG. 1B, FIG. 1C, and FIG. 1D, assuming the external magnetic field coupled onto the sensor core region to be constant over one cycle of core excitation.
Figure 2B:
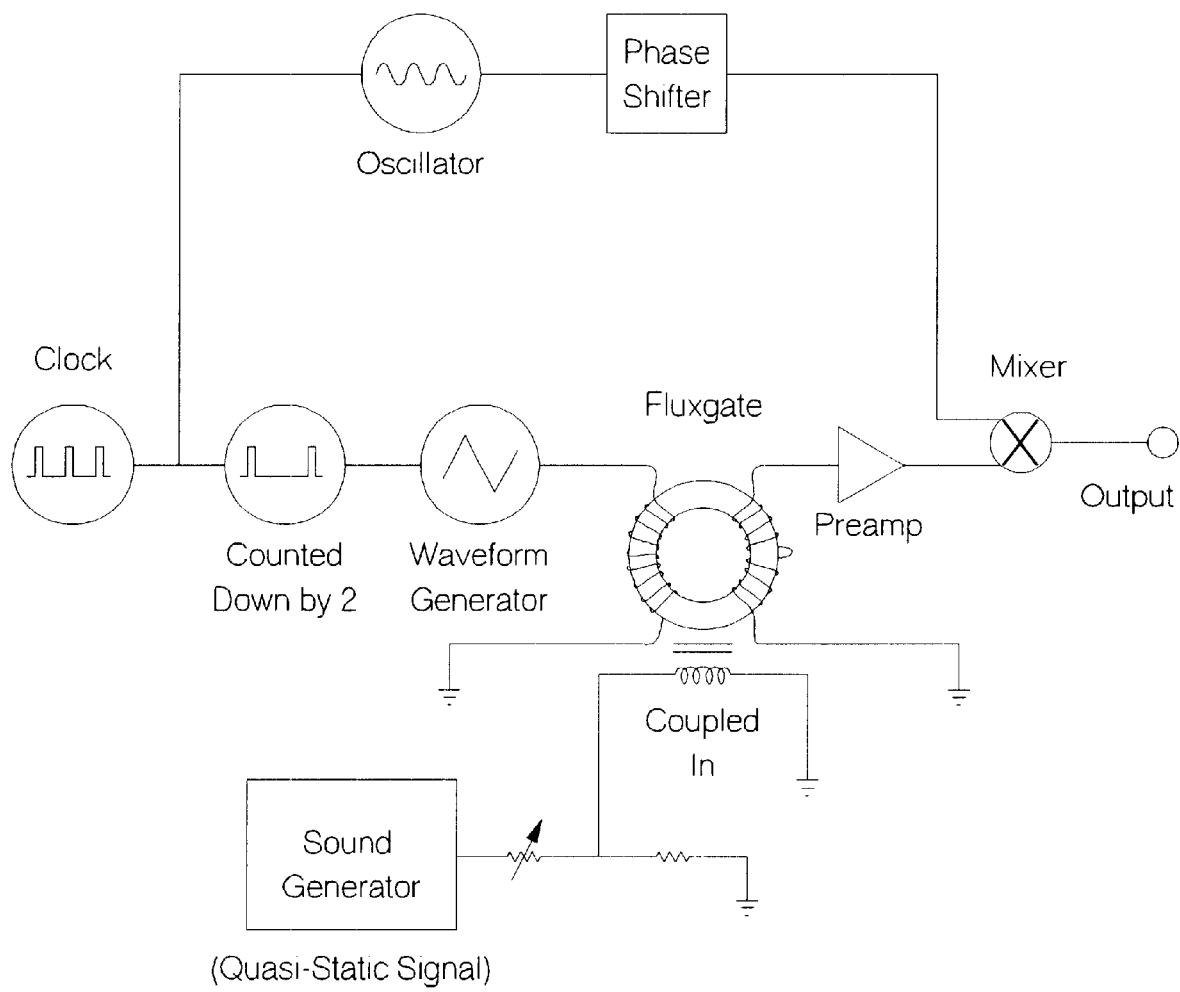
FIG. 2B shows the setup of fluxgate measurements contained in the art wherein a weak quasi-static magnetic signal, for example, a sound-wave signal, is expressed onto the sensor core region.
Figure 2C:
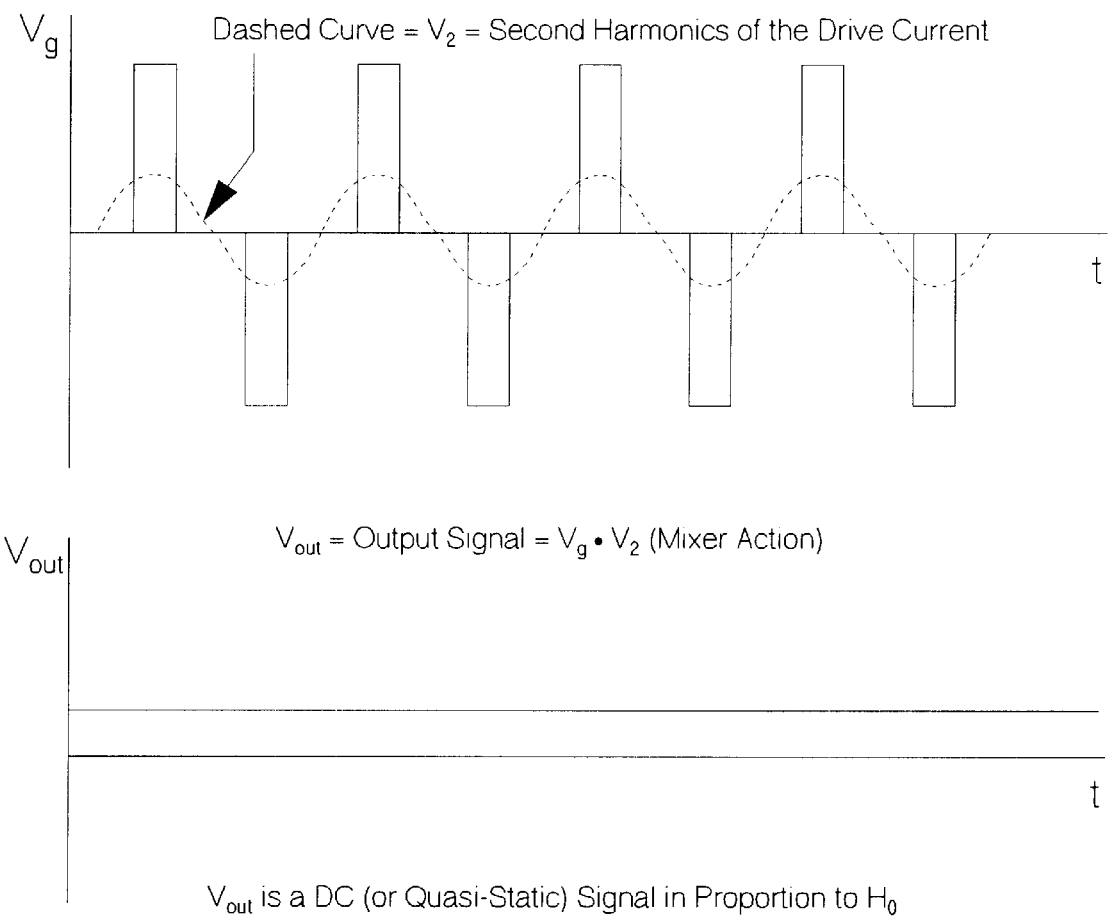
FIG. 2C illustrates the operation of a fluxgate magnetometer contained in the art wherein the mixer action is demonstrated and the output signal is obtained as the inner product of the gated signal following the magnetometer and the second-harmonic waveform of the core-excitation current, assuming the expressed external field is a relatively slow-varying field.

Prior Art—FIG. 2A, FIG. 2B, FIG. 2C

In order to fully understand the operation of a fluxgate magnetometer performing dynamic detection, it is instructive to contrast its operation first with static detection, as contained by the art. FIG. 2A summarizes the graphic solutions presented in FIG. 1B, FIG. 1C, and FIG. 1D. An external voltage $V_0$, which is assumed to be constant over one period of core excitation, generates a magnetic field $H_0$, which is coupled onto the core region of the fluxgate magnetometer. As shown at lower-left of FIG. 2A, the fluxgate magnetometer is excited by a periodic triangular waveform, $I_D$, and the output, $V_g$, is collected following a Preamp. The excitation waveform, $I_D$, is also shown at upper-right of FIG. 2A, which traces out a hysteretic loop characteristic of the core material in the $M-I_D$ plane, as shown at upper-left of FIG. 2A. As explained previously, nonlinearity occurs at saturation-transition regions, called saturation knees in the literature, which designate the active regions that a fluxgate is operational in sensing an external magnetic field expressed in the core region. Saturation-transition regions, or saturation knees, are marked with the magnetization curve, upper-left, and with the excitation current, upper-right, both shown as dashed circles. Output pulses are generated, which are aligned with the saturation-transition regions, or the transition knees, in the time domain with polarization altered alternatively.

FIG. 2B shows the setup of a fluxgate magnetometer contained in the art capable of measuring a slow-varying magnetic signal, such as that associated with a sound wave. The sound-wave signal is expressed onto the core region, and the core is excited by a triangular waveform with the gated signal being collected by a Preamp. The gated signal from the fluxgate, $V_g$, is mixed with the second harmonics of the driving current, $V_2$, to generate an output, $V_{out}$. Both waveforms of $V_g$ and $V_2$ are shown at top of FIG. 2C, and their mixed signal $V_{out}$ is shown at bottom of FIG. 2C, which is relatively a time constant as assumed by the quasi-static measurements of the art. The mixer action shown in FIG. 2C is equivalent to perform inner product of $V_g$ and $V_2$. In order to obtain an optimal magnitude in $V_{out}$, and hence the maximum detection sensitivity of the fluxgate magnetometer, $V_2$ needs to be tuned in phase with $V_g$, and this tuning action can be obtained by adjusting the phase of $V_2$ as shown in FIG. 2B.

Method of Obtaining Miniature Fluxgate Magnetometer

The ring-core fluxgate magnetometer shown in FIG. 1A occupies a considerable volume whose fabrication is incompatible with the current printing circuit technologies. Also, the ring-core geometry precludes the possibility that a local field could be fed onto the core region enabling fluxgate operation. Obviously, the fluxgate sensor can not be included with a recording head reading the stored data in a magnetic medium at high speed, although the fluxgate sensor has shown a sensitivity superior to any other known sensors operating at room temperatures.

In order to remotely sense a magnetic field the field needs to be coupled into a pair of ferromagnetic detection arms connected to the sensor core to which inductor coils are attached. To construct a fluxgate sensor, the ferromagnetic core, the excitation coils, the pickup coils, and the detection arms need to be arranged in a manner permitting fluxgate operation, as discussed previously in association with the operation of a ring-core fluxgate sensor. That is, the fluxgate circuit needs to show a balanced structure and the input flux from the detection arms and the excitation flux generated by the excitation coils lie parallel and antiparallel respectively in two halves of the sensor core wound with pickup coils. Two preferred examples are thus given in this invention for which the pickup coils show either the same or opposite sense of induction, respectively.

Furthermore, the disclosed examples allows the fluxgate sensors to be used as magnetic recording heads performing both the reading and the writing functions in one device. That is, during the read cycle the pickup coils are used to detect the weak signal associated with the magnetic field generated by a stored data bit. The weak signal is conducted through the detection arms having a gap at their tips so as to couple in the magnetic field of the data bit. However, during the write cycle a data bit is written at the tips of the detection arms by applying a writing current at the same pickup coils. Due to the symmetry of the circuits the excitation coils show very little effect on the data bit, either in reading or in writing, since they generate an insignificant magnetic field at the tips of the detection arms. Most importantly, the disclosed fluxgate circuits can be miniaturized whose fabrication is fully compatible with the current printing circuit technologies. Planar cores and coils have now been widely used for magnetic recording heads (please refer to: J. Brug, M. Bhattacharyya, T. Anthony, L. Tran, and J. Nickel, "Magnetic Recording Heads," in "Encyclopedia of Electrical and Electronics Engineering," edited by J. G. Webster, vol. 12, pp.74–91, John Wiley, 1999).

Method of Obtaining Dynamic Measurements Using a Fluxgate Magnetometer

As described in the art, a fluxgate sensor is mainly used for the detection of a quasi-static magnetic field. However, as discussed previously in association with FIG. 1D, a fluxgate sensor can also be used to detect a dynamic signal, provided that the excitation of the sensor core is synchronized with the repetition rate of the signal. This implies that a fluxgate sensor can be beneficially used as a recording head reading magnetic digital data at high speed. Let the data bits appear at a rate $f$. The fluxgate sensor would show optimal performance if the excitation current is of a frequency $f/4$, and the data bits occur concurrently with the saturation-transition regions of the magnetization processes. Due to the phase-locked feature of the detection scheme, the noise content can be reduced significantly, thereby improving the sensitivity considerably. Another advantage of using a fluxgate recording head is that the excitation frequency is lowered by a factor of 4 when comparing to an induction recording head employed in the art.

Figure 3:
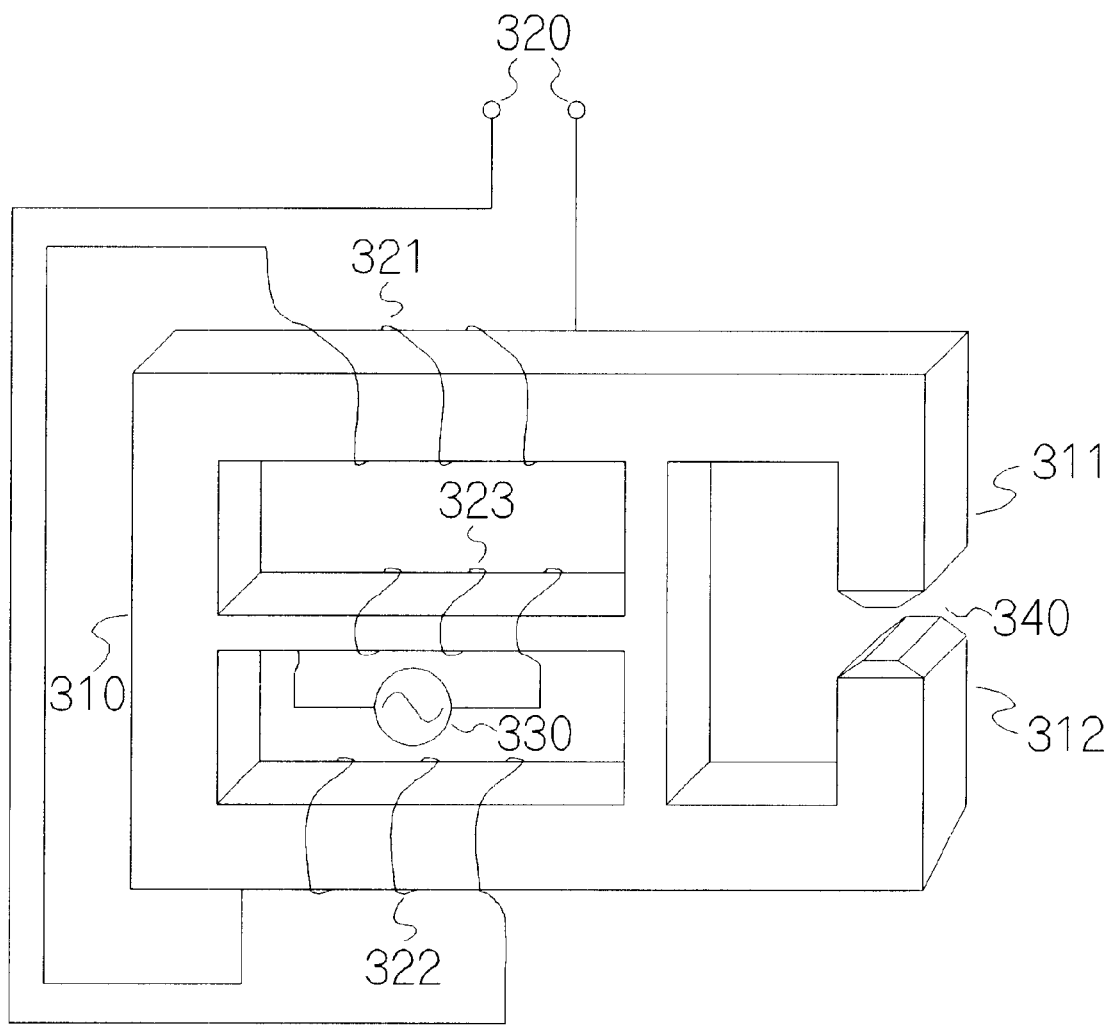
FIG. 3 shows one example that a fluxgate sensor is fabricated with extended detection arms facilitating remote sensing of a local magnetic field. The two pickup coils are connected with the same sense of induction. The fluxgate circuit can be miniaturized compatible with the current printing-circuit technologies. The fluxgate circuit provides dual read and write functions when used as a magnetic recording head.

Preferred Embodiment—FIG. 3

A preferred embodiment of the closure of the present invention is illustrated in FIG. 3 for which a fluxgate magnetometer is constructed with detection arms which are connected to a ferromagnetic core frame wound by balanced pickup and excitation coils. The induction sense of the two pickup coils are the same. The fluxgate circuit shown in FIG. 3 can remotely sense a local field.

In FIG. 3 the core frame 310 is wound with an excitation coil 323 and two pickup coils 321 and 322, connected in series with the same induction sense. The excitation coil 323 is connected to a current source 330, and the pickup terminals 320 are connected to detection electronics in a manner described previously. Two ferromagnetic detection arms 311 and 312 are connected to the fluxgate core 310 so that a magnetic field appearing at the gap 340 formed by the tips of the two arms 311 and 312 is coupled to the fluxgate core 310. This coupled flux is parallel to the excitation flux in one pickup coil, but antiparallel in the other pickup coil, as required by the fluxgate operation. Due to the symmetry of the fluxgate circuit the induced electromotive force is zero in the absence of an external magnetic field.

The fluxgate circuit shown in FIG. 3 can be used to remotely sense a magnetic field. It can be used as a magnetic recoding head detecting the magnetic field associated with a data bit stored in a magnetic medium. The tips of the detection arms 311 and 312 are placed in close proximity to the data bit. Or, if a separate write core is used, the tips couple with the write core during the read cycle. Alternatively, the fluxgate circuit shown in FIG. 3 can also provide the write function by itself. That is, during the write cycle, the pickup coil 322 and 323 carry a write current, which generate a magnetic field at the tips of the detection arms 311 and 312, writing a data bit onto the magnetic medium placed in close proximity. The excitation current provided by the current source 330 generates a negligible magnetic field at the tips of the detection arms 311 and 312 due to the symmetry of the fluxgate circuit. The fluxgate circuit shown in FIG. 3 can be miniaturized whose fabrication is fully compatible with the current printing-circuit technologies facilitating mass production in large volumes.

Figure 4A:
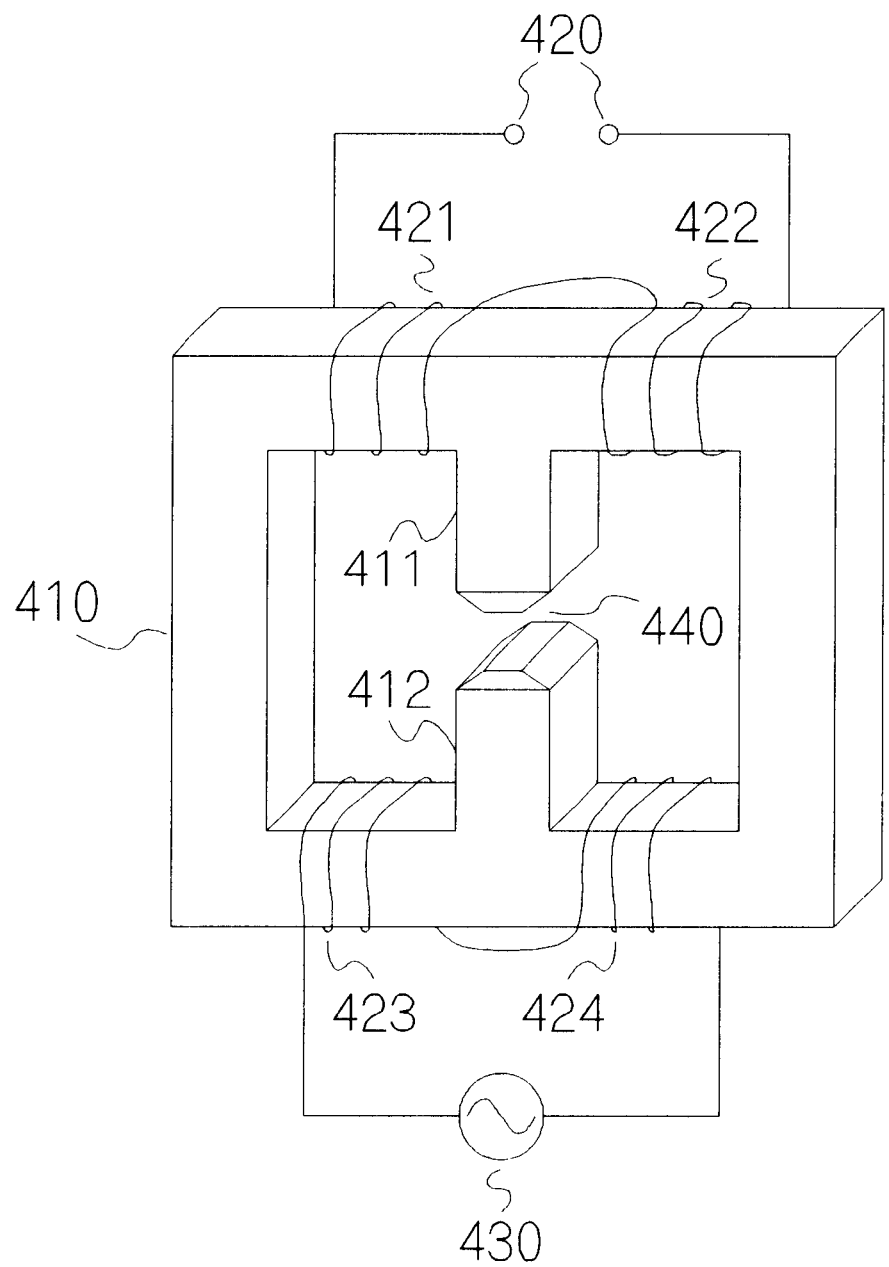
FIG. 4A shows one example that a fluxgate sensor is fabricated with extended detection arms facilitating remote sensing of a weak magnetic field. The two pickup coils are connected with opposite sense of induction. The fluxgate circuit can be miniaturized compatible with the current printing-circuit technologies. The fluxgate circuit provides dual read and write functions when used as a magnetic recording head.

Preferred Embodiment—FIG. 4A

A preferred embodiment of the closure of the present invention is illustrated in FIG. 4A for which a fluxgate magnetometer is constructed with detection arms which are connected to a ferromagnetic core frame wound by balanced pickup and excitation coils. The induction sense of the two pickup coils are opposite to each other. The fluxgate circuit shown in FIG. 4A can remotely sense a local field.

In FIG. 4A the core frame 410 is wound with an excitation coil divided in two identical parts 423 and 424 to achieve a balanced structure. Two pickup coils 421 and 422, connected in series with opposite sense of induction, are also wound around the core frame 410. The excitation coil 423 and 424 is connected to a current source 430, and the pickup terminals 420 are connected to detection electronics in a manner described previously. Two ferromagnetic detection arms 411 and 412 are connected to the fluxgate core 410 so that a magnetic field appearing at the gap 440 formed by the tips of the two arms 411 and 412 is coupled to the fluxgate core 410. The coupled flux is parallel to the excitation flux in one pickup coil, but antiparallel in the other pickup coil, as required by the fluxgate operation. Due to the symmetry of the fluxgate circuit the induced magnetomotive force is zero in the absence of an external magnetic field.

The fluxgate circuit shown in FIG. 4A can be used to remotely sense a magnetic field. It can be used as a magnetic recoding head detecting the magnetic field associated with a data bit stored in a magnetic medium. The tips of the detection arms 411 and 412 are placed in close proximity to the data bit. Or, if a separate write core is used, the tips couple with the write core during the read cycle. Alternatively, the fluxgate circuit shown in FIG. 4A can also provide the write function by itself. That is, during the write cycle, the pickup coil 422 and 423 carry a write current, which generate a magnetic field at the tips of the detection arms 411 and 412, writing a data bit onto the magnetic medium placed in close proximity. The excitation current provided by the current source 430 generates a negligible magnetic field at the tips of the detection arms 411 and 412 due to the symmetry of the fluxgate circuit. The fluxgate circuit shown in FIG. 4A can be miniaturized whose fabrication is fully compatible with the current printing-circuit technologies facilitating mass production in large volumes.

Figure 4B:
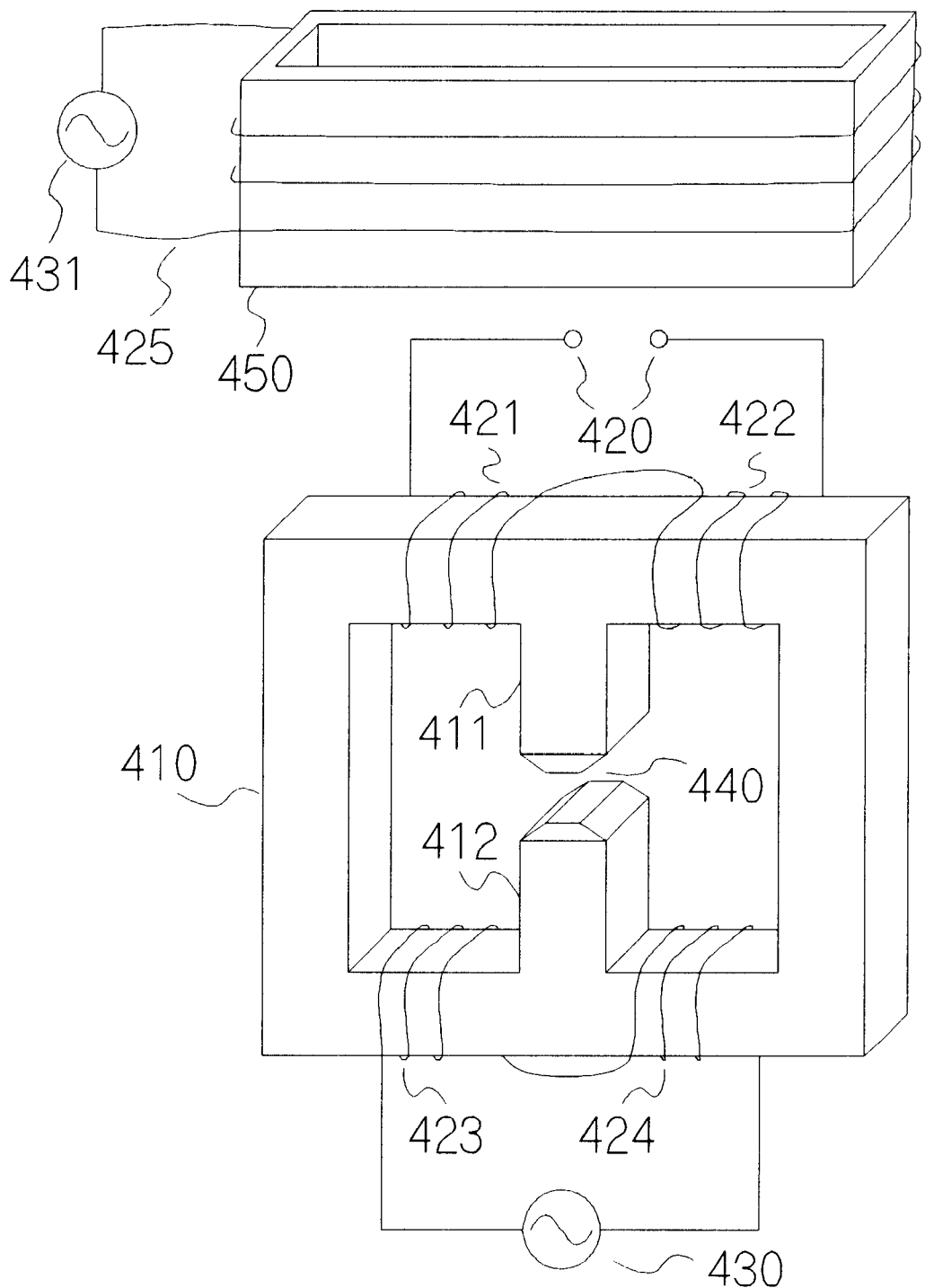
FIG. 4B shows another example that in-plane magnetization rotation is introduced with the fluxgate sensor shown in FIG. 4A, minimizing domain-wall motion thereby improving sensitivity.

Alternative Embodiment—FIG. 4B

There are various possibilities to incorporate the present invention in many fluxgate geometries. In-plane magnetization rotation may be introduced with the fluxgate operation in a ring-core sensor so as to improve the noise performance. Similar arrangement can be made to the fluxgate circuits disclosed in the present invention facilitating remote sensing of a local magnetic field. FIG. 4B shows an example that in-plane magnetization rotation is introduced with core excitation for the fluxgate circuit shown in FIG. 4A.

As before, in FIG. 4A the core frame 410 is wound with an excitation coil divided in two identical parts 423 and 424 to achieve a balanced structure. Two pickup coils 421 and 422, connected in series with opposite sense of induction, are also wound around the core frame 410. The excitation coil 423 and 424 are connected to a current source 430, and the pickup terminals 420 are connected to detection electronics in a manner described previously. Two ferromagnetic detection arms 411 and 412 are connected to the fluxgate core 410 so that a magnetic field appearing at the gap 440 formed by the tips of the two arms 411 and 412 is coupled to the fluxgate core 410.

However, in order to induce an in-plane rotating magnetic field a second excitation coil is needed, whose orientation is orthogonal to the first excitation coil generating a transverse magnetic field in phase quadrature. In FIG. 4B a second coil 425 winds around a hollow non-magnetic support 450 fed by a current source 431, which is in phase quadrature with respect to the current source 430. The core frame 410 is inserted inside the hollow support 450 so that the ferromagnetic material enclosed by the pickup coils 421 and 422 is entirely covered by the support 450. As such, in-plane magnetization rotation is reinforced during fluxgate operation and an electromotive force is induced at the pickup terminals 420. The rotating field derived from the current sources 430 and 431 needs not to show uniform rotation. Since domain-wall motion is minimized in the active core sensing region, the sensitivity of the fluxgate sensor is thus improved.

Figure 5A:
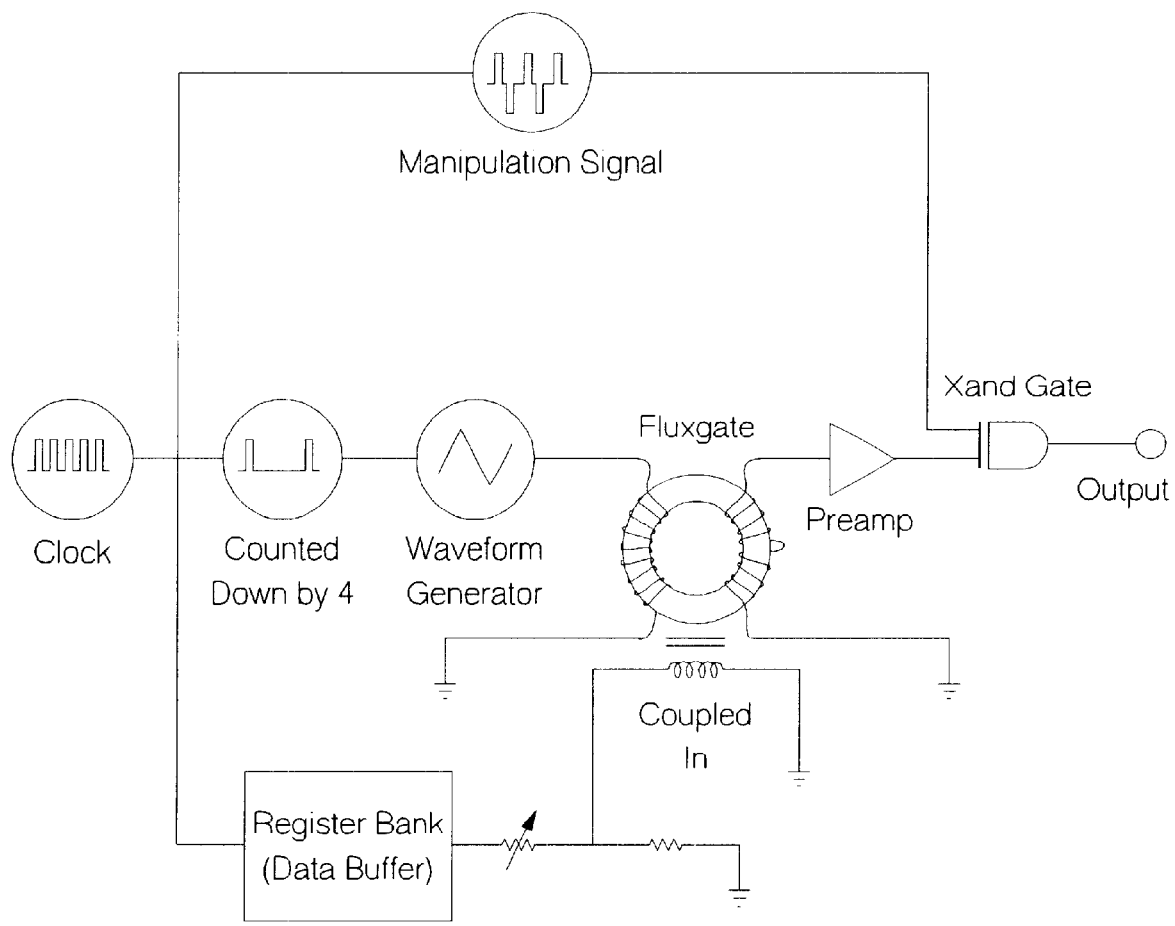
FIG. 5A shows the setup of a fluxgate magnetometer on measuring a dynamic magnetic signal containing digital bits whose passage is synchronized with the excitation of the sensor core. In this example of the preferred embodiment of the present invention 4 data bits are read or detected by the fluxgate device during each cycle of core excitation.
Figure 5B:
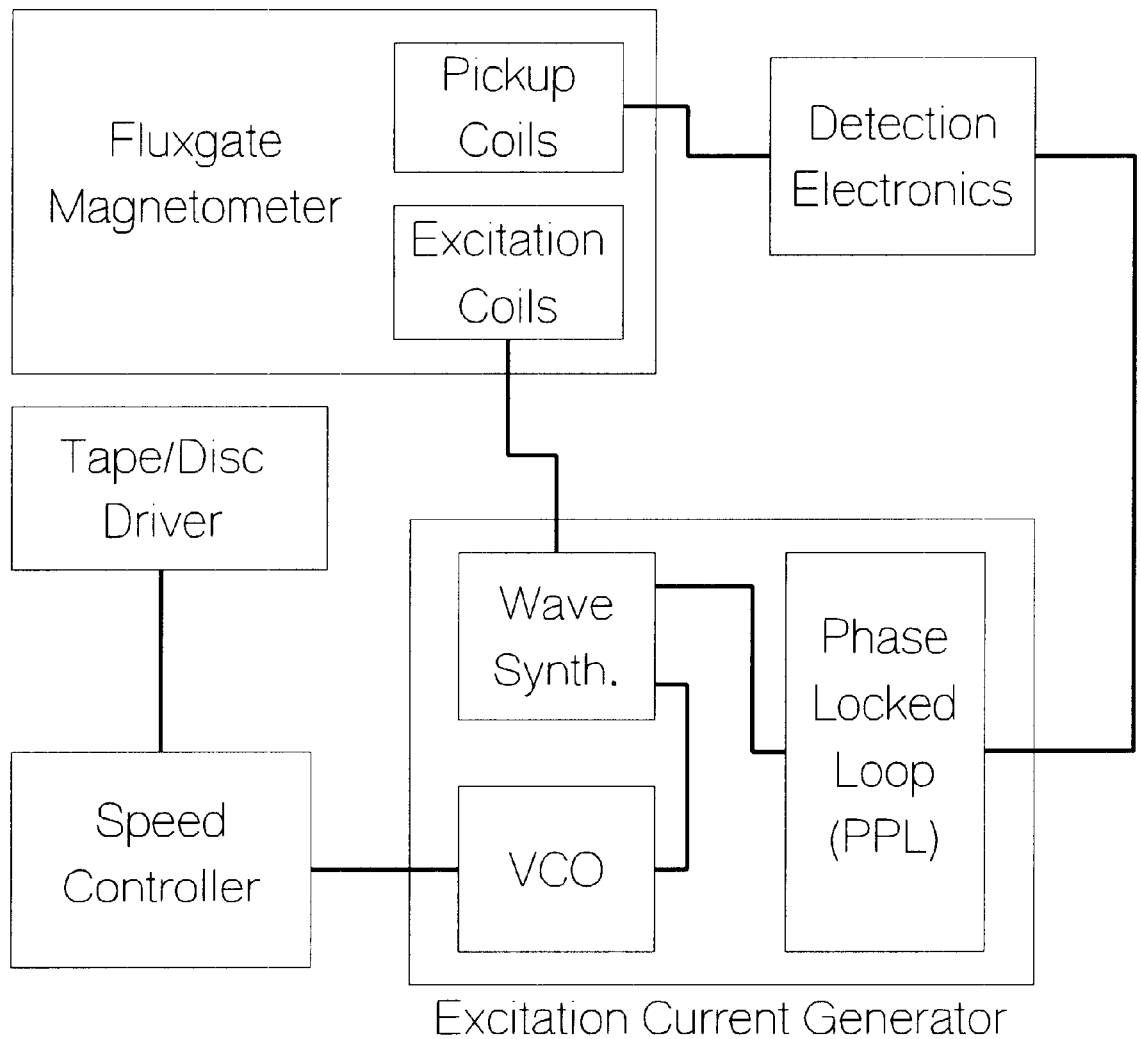
FIG. 5B shows the block diagram of the control circuit enabling a fluxgate magnetometer to perform dynamic measurements on a string of magnetic digital data. The fluxgate magnetometer reads or detects data stored in a magnetic medium (tape or disc) and the reading or detection action is synchronized with the waveform of the excitation current applied to the sensor core.
Figure 5C:
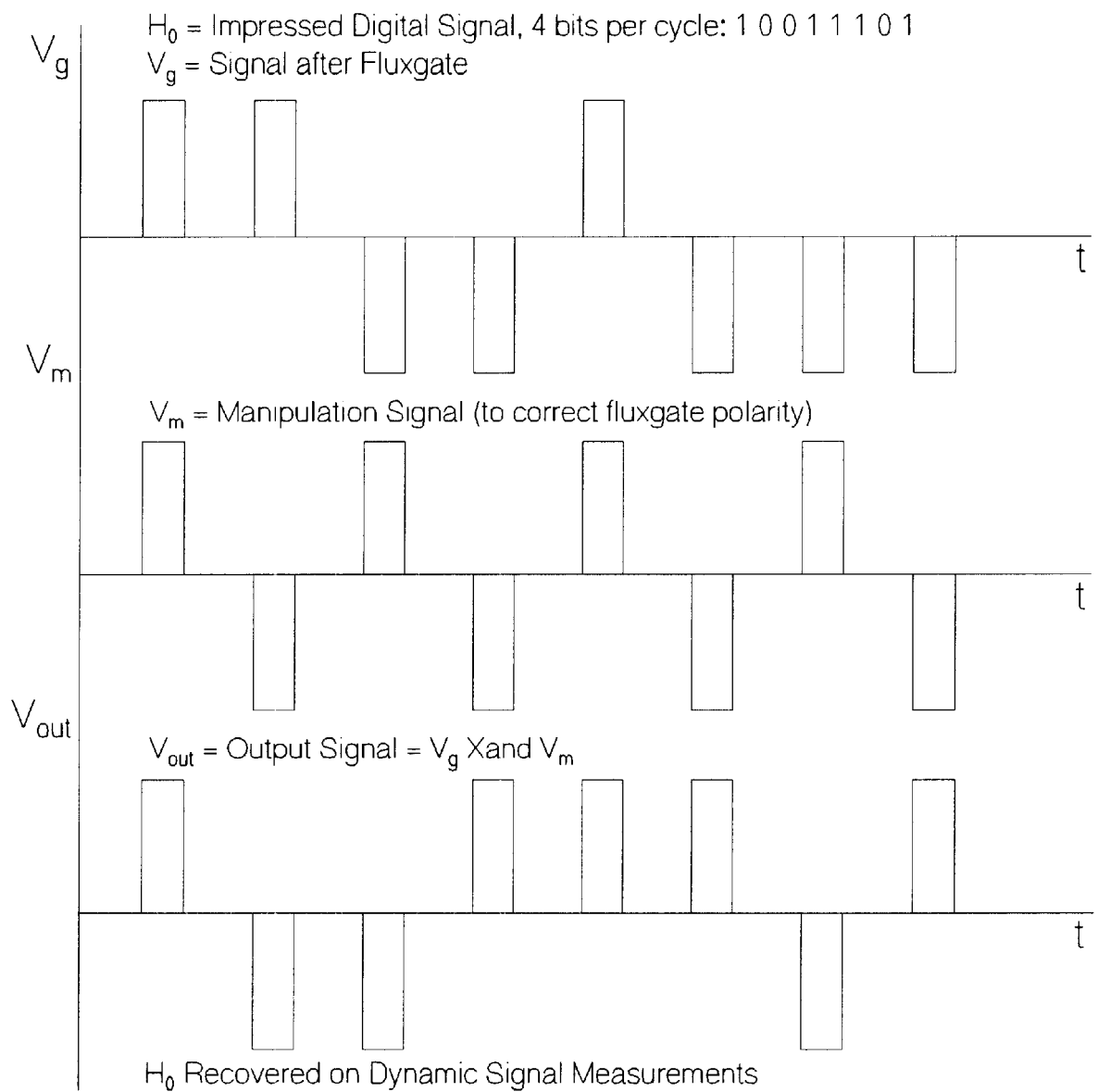
FIG. 5C shows an example of the detection scheme illustrated in FIG. 5A.

Preferred Embodiment—FIG. 5A, FIG. 5B, FIG. 5C

FIG. 5A shows an example of setup enabling a fluxgate magnetometer to measure a dynamic magnetic signal comprising a digital sequence of data bits flowing at a rate 4 times the excitation rate of the sensor core. The digital signal is stored in Data Buffer to be expressed sequentially onto the core region of the fluxgate magnetometer synchronized with the system clock. Manipulation signal is also generated from the clock signal with polarization of pulses being altered alternatively. The clock signal is counted down by 4 to trigger a waveform generator, which produces a current of a triangular waveform feeding into the primary windings of the sensor core, or excitation coils, exciting the core material to passing across magnetization saturations from both the north-to-south and the south-to-north directions. The gated signal from the fluxgate is gathered by a Preamp, and both the gated signal and the manipulation signal are fed into an exclusive-and (Xand) gate to produce an output.

As mentioned previously, in order to obtain optimal detection on fluxgate operation the pulses carried with the manipulation signal shown in FIG. 5A need to be tuned to occur concurrently with the saturation-transition regions, or the saturation knees, shown in FIG. 2A. That is, phase-locked loop(s) may be employed in a control circuit to automatically check the occurrence of the saturation knees synchronized with the data-bit transition. FIG. 5B shows the block diagram of such a control circuit illustrating this desired operation, wherein a fluxgate magnetometer is used with a magnetic recording head to read data bits stored in a magnetic medium. The speed controller controls the speed of the driver of the medium, to be either a tape driver, a drum driver, or a disk driver. Meanwhile, it sends a voltage proportional to the speed of the medium driver to the VCO (voltage controlled oscillator) located in the Excitation Current Generator block, which generates a periodic waveform for the excitation current synchronized with the medium driver. During the read cycle the Detection Electronics sends a signal to Phase Locked Loop (PPL) located in the Excitation Current Generator block. This signal depicts the voltage proportional to the misalignment that the center of one data bit has been displaced from the center of the corresponding saturation-transition region of the magnetization process. Although more PPLs up to 4 may be employed in the control circuit, it is thought 1 is sufficient, accounting for the time delay due to the hysteretic behavior of the fluxgate core material, as explained previously in association with FIG. 1B.

The Phase Locked Loop employed in FIG. 5B monitors and locks the relative phases between core excitation and data-bit transition, and when phase misalignment is detected, Phase Locked Loop sends a signal to Wave Synthesizer allowing the waveform of the excitation current to be modified accordingly. Wave Synthesizer generates drive currents feeding into Excitation Coils located in the Fluxgate Magnetometer block, thereby enabling synchronized and phase-locked operation. Thus, the data bits stored in the magnetic medium can be read at high speed with high accuracy.

FIG. 5C shows an example that a dynamic magnetic signal, $H_0$, containing a digital sequence of 1001101 is detected using a fluxgate magnetometer whose setup is shown in FIG. 5A. In FIG. 5A the gated signal after Preamp is $V_g$, and the manipulation signal is $V_m$, which are shown at top and middle of FIG. 5C, respectively. The output signal, $V_{out} = V_g$ xand $V_m$, is thus constructed, whose waveform is shown at bottom of FIG. 5C, manifested as a duplicate of the original signal of $H_0$.

By definition performing dynamic detection using a fluxgate magnetometer implies the expressed magnetic signal is varying at a rate no slower than the rate that the sensor core is being excited. In the preferred embodiment of the present invention 4 data bits are detected or read during each detection cycle, since 4 saturation knees are traversed in one hysteresis loop, identified as 4 detection windows upon each magnetization cycle, as shown in FIG. 2A. However, by fabricating a fluxgate core using two different magnetic materials showing distinct magnetization-saturation values, for example, 8 magnetization knees are traversed upon each magnetization cycle, assuming both of the core materials are excited achieving fully magnetization saturations from both the north-to-south and the south-to-north directions. As such, 8 data bits are detected or read during each cycle of detection. Of course, more data bits can be detected or read upon each detection cycle if more materials are included in the sensor core, exhibiting distinct values in magnetization saturations.

Alternatively, slower detection rate may be assumed. For example, if the data-bit transition is synchronized with the occurrence of the first pulse, or with the occurrence of the first and the third pulses of the clock signal during each of the magnetization cycle, there is no need to include the manipulation signal in the detection scheme. As such, the detection circuit is simplified, and the Xand gate shown in FIG. 5A can be removed. The detection rate is thus same, or twice, the magnetization rate of the fluxgate sensor-core, respectively, and one bit or two bits are being detected or read during each detection or magnetization cycle.

It is shown in FIG. 5C that pulses in $V_g$ are aligned vertically with pulses in $V_m$. If the digital bits are traveling at a constant and fixed speed in the time domain, this pulse-alignment requirement can be achieved by using a Phase Shifter in a manner shown in FIG. 2B, or more precisely, a delay-line element. Otherwise, phase locked loop shown in FIG. 5B needs to be employed to ensure this pulse-alignment condition. Or, pulse width in $V_m$ can be made much wider than that in $V_g$ so that the detection scheme is insensitive to the pulse position in $V_g$, giving rise to the same output pulses in $V_{out}$. This eliminates the use of phase locked loop in FIG. 5B, rendering less-involved detection electronics for the fluxgate measurements.

The setup of FIG. 5A also serves as a high-speed digitizer. For this application a weak dynamic signal is expressed onto the core region of the fluxgate magnetometer, and after fluxgate detection this dynamic signal is recovered in the digital form. That is, a fluxgate core is able to view or to sense an expressed magnetic signal only when saturation knees are encountered during the magnetization processes. The expressed magnetic signal can be an analog signal, provided that variation of the signal is no faster than the clock rate. The polarity of the gated digital bits needs to be corrected, in a manner by employing the manipulation signal shown in FIG. 5A.

CONCLUSIONS

The present invention discloses a method to achieve fluxgate operation allowing for detection arms to be extended from the sensor core to remotely sense a local magnetic field. The disclosed fluxgate circuits can be used as magnetic recording heads providing simultaneously sensitive reading and writing functions at high speed. The disclosed fluxgate circuits can be miniaturized whose fabrication is fully compatible with the current printing circuit technologies, facilitating mass production in large volumes thereby improving reliability and reducing costs.

The present invention also disclose a method allowing a fluxgate sensor to measure dynamic signals at high speed. This requires the source excitation of the sensor core to be synchronized with the signal rate so that in-phase gating or filtering is possible. This detection scheme is mostly desirable for magnetic recording head applications, since high speed, high accuracy recording heads are always in demand in magnetic storage industries.

The present invention also disclose a magnetic recording head device which allows magnetic digital signals to be read at high speed with high accuracy. The data-bit transitions are synchronized with core excitation of a fluxgate magnetometer so that data bits occur concurrently with the saturation-transition regions during the magnetization processes. By using a fluxgate magnetic recording head, a write current can be supplied with the pick-up coils of the sensor device, thereby enabling the write action during the write cycle.

The scope of the invention should be determined by the appended claims and their legal equivalent, rather than by the examples given. It is also understood that the following claims are to cover all generic and specific features of the invention described herein, and all statements of the scope of the invention which, as a matter of language, might be said to fall therebetween.

I claim:

1. A method of obtaining fluxgate operation performing measurements on dynamic magnetic signals, comprising:

A) applying a magnetic sensor core showing symmetry on two equal halves,

B) applying two drive coils with symmetry surrounding said two equal halves of said magnetic sensor core, C) applying two pickup coils with symmetry surrounding said two equal halves of said magnetic sensor core whose winding senses or directions are, respectively, parallel and antiparallel to those of said two drive coils with symmetry, D) coupling said dynamic magnetic signals in said two equal halves of said magnetic sensor core capable of generating equal electromotive forces of the same sign in said two pickup coils with symmetry, wherein by feeding said two drive coils with symmetry with a drive current exciting said two equal halves of said magnetic sensor core encompassing magnetic saturation states from both north-to-south and south-to-north directions in alternation synchronized with the passage of said dynamic magnetic signals the properties of said dynamic magnetic signals can be characterized, thereby giving rise to a quantitative measure on said dynamic magnetic signals.

2. The method of claim 1 wherein said dynamic magnetic signals are characterized concurrently with the occurrence of saturation knees taking place during the magnetization process of said two halves of said magnetic sensor core excited by said drive current.

3. The method of claim 1 wherein said dynamic magnetic signals include the time-varying magnetic field generated from data bits stored in a magnetic medium passing across a magnetic recording head at high speed.

4. The method of claim 3 wherein said magnetic recording head contains said magnetic sensor core as component.

5. The method of claim 3 wherein 4 data bits are characterized during each cycle of the magnetization process taking place within said two halves of said magnetic sensor core excited by said drive current.

6. The method of claim 1 wherein said dynamic magnetic signals are digitized upon said measurements of said fluxgate operation, thereby providing high-speed analog-to-digital conversion on said dynamic magnetic signals.

7. A magnetic recording head device capable of performing the read function on a sequence of magnetic digital bits, comprising A) a magnetic sensor core consisting of two equal halves with symmetry, B) a pair of pickup coils with symmetry surrounding said equal halves of said magnetic sensor core with symmetry, C) a pair of drive coils with symmetry surrounding said equal halves of said magnetic sensor core with symmetry capable of generating equal but opposite magnetomotive forces in said pair of said pickup coils with symmetry, wherein by coupling in said sequence of said magnetic digital bits generating equal magnetomotive forces of the same sign in said pair of said pickup coils with symmetry, enforcing the passage of said magnetic digital bits to occur concurrently with saturation knees of the magnetization process induced by a drive current feeding onto said pair of said drive coils with symmetry, the sign and magnitude of said magnetic digital bits are characterized, giving rise to a quantitative measure of said sequence of said magnetic digital bits.

8. The magnetic recording head device of claim 7 wherein 4 of said magnetic digital bits are read or characterized during each cycle of said magnetization process induced by said drive current feeding onto said pair of said drive coils with symmetry.

9. The magnetic recording head device of claim 7 wherein phase-locked-loops are used to ensure synchronization of said passage of said sequence of said magnetic digital bits with the occurrence of said magnetization process induced by said drive current feeding said pair of said drive coils with symmetry.

10. The magnetic recording head device of claim 7 wherein during the write cycle a write current is applied, feeding onto said pair of said pickup coils with symmetry to generate a dynamic writing magnetic field consisting of a sequence of digital-bit signals capable of magnetizing a magnetic storage medium placed nearby.

* * * * *